United States Patent
Clevenger et al.

(10) Patent No.: US 8,486,751 B2
(45) Date of Patent: Jul. 16, 2013

(54) METHOD OF MANUFACTURING A PHOTOVOLTAIC CELL

(75) Inventors: Lawrence A. Clevenger, LaGrangeville, NY (US); Harold J. Hovel, Yorktown Heights, NY (US); Rainer Klaus Krause, Mainz (DE); Kevin S. Petrarca, Newburgh, NY (US); Gerd Pfeiffer, Poughquag, NY (US); Kevin M. Prettyman, Poughkeepsie, NY (US); Brian C. Sapp, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 354 days.

(21) Appl. No.: 12/952,465

(22) Filed: Nov. 23, 2010

(65) Prior Publication Data

US 2011/0120519 A1 May 26, 2011

(51) Int. Cl.
*H01L 21/00* (2006.01)
*H01L 21/66* (2006.01)

(52) U.S. Cl.
USPC .............. 438/98; 438/16; 438/17; 136/256; 136/290

(58) Field of Classification Search
USPC ............... 438/16, 17, 57, 66, 98; 136/290, 136/252, 256
See application file for complete search history.

(56) References Cited

U.S. PATENT DOCUMENTS

| | | | |
|---|---|---|---|
| 5,501,744 | A | 3/1996 | Albright et al. |
| 5,578,502 | A | 11/1996 | Albright et al. |
| 6,028,994 | A | 2/2000 | Peng et al. |
| 6,331,672 | B1 | 12/2001 | Matsuda et al. |
| 6,706,963 | B2 | 3/2004 | Gaudiana et al. |

OTHER PUBLICATIONS

H. Field et al., "Cell Binning Method Analysis to Minimize Mismatch Losses and Performance Variation in Si-Based Modules," IEEE 0-7803-7471 Jan. 2, 2002 p. 418.
K. Wilson et al., "Measuring the Effect of Cell Mismatch on Module Output," IEEE 1-4244-0016 Mar. 6, 2006 p. 916.

*Primary Examiner* — David Vu
*Assistant Examiner* — Earl Taylor
(74) *Attorney, Agent, or Firm* — Michael J. LeStrange (57) ABSTRACT

A method of manufacturing a photovoltaic cell using a semiconductor wafer having a front side and a rear side, wherein the photovoltaic cell produces electricity when the front side of the semiconductor wafer is illuminated.

14 Claims, 8 Drawing Sheets

| Characterization Parameter | Improvement | Contribution | Ranking | Slope | Functions |
|---|---|---|---|---|---|
| Front Surface Recombination | 29,14% | 23,03% | very high | 6,44E-007 | $f(x) = -0,0068 \ln(x) + 0,2953$ |
| Base Contact | 28,47% | 22,50% | very high | 3,96 | $f(x) = -3,958\ x + 0,257$ |
| Carrier Life Time | 18,86% | 14,91% | high | 1,97E-003 | $f(x) = 0,014 \ln(x) + 0,1873$ |
| Rear Surface Recombination | 15,01% | 11,86% | high | 3,66E-006 | $f(x) = -0,0032 \ln(x) + 0,2608$ |
| n-doping | 12,80% | 10,12% | medium | 1,6E-023 | $f(x) = -1,59e\text{-}23x + 2,48e\text{-}1$ |
| External Front Reflectance | 11,96% | 9,45% | medium | 2,6E-003 | $f(x) = -0,0026\ x + 0,2522$ |
| Internal Rear Reflectance | 7,29% | 5,76% | low | 2,7E-004 | $f(x) = 0,00027\ x + 0,21979$ |
| p-doping | 2,81% | 2,22% | low | 1,12E-019 | |
| Emitter Contact | 0,18% | 0,14% | very low | 4,3 | |

Fig. 4

$$fsv_n = f(fsv_{measure})_n * fsv_{weight}$$
$$bc_n = f(bc_{measure})_n * bc_{weight}$$
$$clt_n = f(clt_{measure})_n * clt_{weight}$$
$$rsv_n = f(rsv_{measure})_n * rsv_{weight}$$
$$nd_n = f(nd_{measure})_n * nd_{weight}$$
$$efr_n = f(efr_{measure})_n * efr_{weight}$$
$$irr_n = f(irr_{measure})_n * irr_{weight}$$

$$fe_n = fsv_n + bc_n + clt_n + rsv_n + nd_n + efr_n + irr_n$$

| Measured Values Analysis | Cell 1 | Cell 2 | Cell 3 | Cell 4 | Cell 5 | Cell 6 | Cell 7 | Cell 8 | Mean | Stdl. Dev. | Range |
|---|---|---|---|---|---|---|---|---|---|---|---|
| fsv Measure [cm/s] | 500 | 700 | 1200 | 1400 | 800 | 1100 | 1500 | 900 | 1012,5 | 348,2097069 | 1000 |
| bc Measure [ohm] | 0,01 | 0,05 | 0,008 | 0,005 | 0,015 | 0,03 | 0,012 | 0,02 | 0,01875 | 0,01485886 | 0,045 |
| dt Measure [μs] | 5 | 15 | 8 | 35 | 80 | 120 | 55 | 25 | 42,875 | 40,14771831 | 115 |
| rsv Measure [cm/s] | 100 | 30 | 250 | 10 | 80 | 170 | 300 | 150 | 136,25 | 101,9716347 | 290 |
| nd Measure [cm-3] | 1,20E+18 | 3,00E+20 | 8,00E+19 | 1,50E+20 | 7,50E+18 | 3,00E+19 | 1,50E+20 | 1,50E+21 | 2,77338E+20 | 5,03846E+20 | 1,4988E+21 |
| eff Measure [%] | 10 | 5 | 20 | 15 | 12 | 8 | 6 | 3 | 9,875 | 5,642631099 | 17 |
| irr Measure [%] | 95 | 80 | 87 | 97 | 92 | 89 | 82 | 85 | 88,375 | 6,045954964 | 17 |
| Calculated final Efficiency | 22,7 | 21,4 | 22,5 | 22,6 | 22,0 | 20,1 | 21,5 | 21,0 | 21,73 | 0,89 | 2,56 |
| Measured Efficiency | 16,4 | 15,6 | 15,8 | 16,1 | 16,0 | 14,7 | 15,3 | 15,2 | 15,64 | 0,55 | 1,70 |

| Bin Number | 1 | 2 | 3 | 4 | 5 |
|---|---|---|---|---|---|
| Measured (upper Limit) | 14,8 | 15,2 | 15,6 | 16,0 | 16,4 |
| Calculated (upper Limit) | 20,6 | 21,2 | 21,8 | 22,4 | 23,0 |

Binning Exercise (5 Bins) starting Matrix:

| Cell Number | 1 | 2 | 3 | 4 | 5 | 6 | 7 | 8 |
|---|---|---|---|---|---|---|---|---|
| Calculated Final Efficiency | 22,7 | 21,4 | 22,5 | 22,6 | 22,0 | 20,1 | 21,5 | 21,0 |
| Bin Number | 5 | 3 | 5 | 5 | 4 | 1 | 3 | 2 |
| Measured Efficiency | 16,4 | 15,2 | 15,8 | 16,1 | 15,5 | 14,7 | 15,3 | 15,2 |
| Bin Number | 5 | 2 | 4 | 5 | 3 | 1 | 3 | 2 |

First Iteration Binning Exercise (5 Bins):

| Cell Number | 1 | 2 | 3 | 4 | 5 | 6 | 7 | 8 |
|---|---|---|---|---|---|---|---|---|
| Calculated Final Efficiency | 22,6 | 21,2 | 22,3 | 22,5 | 21,8 | 20,0 | 21,4 | 20,9 |
| Bin Number | 5 | 2 | 4 | 5 | 3 | 1 | 3 | 2 |
| Measured Efficiency | 16,4 | 15,2 | 15,8 | 16,1 | 15,5 | 14,7 | 15,3 | 15,2 |
| Bin Number | 5 | 2 | 4 | 5 | 3 | 1 | 3 | 2 |

Fig. 13

METHOD OF MANUFACTURING A PHOTOVOLTAIC CELL

FIELD OF THE INVENTION

The invention relates to a method of manufacturing a photovoltaic cell, in particular the characterization of a semiconductor wafer used for manufacturing the photovoltaic cell.

BACKGROUND

One way of manufacturing photovoltaic modules is to connect together a plurality of photovoltaic cells. The photovoltaic cells may be connected in series, parallel, or a combination of series and parallel. Typically photovoltaic cells are connected in series, because the electrical power produced by the photovoltaic cells has a smaller voltage (approximately 0.6V) and a larger current (approximately 6.5 A); while the module should have larger voltage and smaller current. This reduces power losses in the wiring coming from the photovoltaic panel.

A difficulty in manufacturing photovoltaic modules is that the efficiency of a single photovoltaic cell may drag down the efficiency of an entire photovoltaic module or portion of a photovoltaic module. For instance if several photovoltaic modules are connected in series, the current will be limited by the photovoltaic cell with the lowest current.

SUMMARY OF THE INVENTION

The embodiments described herein address the aforementioned difficulty by providing for a method of manufacturing a photovoltaic cell using a semiconductor wafer where a set of characterization parameters are measured during the manufacturing process. The characterization parameters may be used to calculate a predicted efficiency of the photovoltaic cell. This predicted efficiency may be used to bin or sort photovoltaic cells such that the groups of photovoltaic cells with a predicted efficiency with a predetermined efficiency range may be used to manufacture a photovoltaic module. Measuring the efficiency of a photovoltaic cell may be insufficient, because the electrical properties of the photovoltaic cell change with temperature and with usage of the photovoltaic cell. The measurement of a set of characterization parameters enables prediction of the cell efficiency under a variety of conditions.

The invention provides for a method of manufacturing a photovoltaic cell using a semiconductor wafer. As used herein a semiconductor wafer is a solid wafer of a semiconductor material. The semiconductor wafer may be crystalline or polycrystalline. Silicon semiconductor wafers are typically used for manufacturing photovoltaic cells. However, other semiconductor materials may also be used. The semiconductor wafer has a front side and a rear side. The photovoltaic cell produces electricity when the front side of the semiconductor wafer is illuminated via the photovoltaic effect. The method comprises the step of doping the semiconductor wafer. Typically semiconductor wafers are manufactured using a p-type doped semiconductor material. During the process of doping a liquid, vapor, or mist is used to deposit doping material on the front side of a semiconductor wafer. The front side of a semiconductor wafer may also be referred to as the front surface. The rear side of a semiconductor wafer may also be referred to as a rear or back surface.

The method further comprises the step of heating the semiconductor in a diffusion furnace after doping the semiconductor wafer. In this step the semiconductor wafer is heated and the n-type dopant diffuses into the front side of the semiconductor wafer. This forms a p-n junction, which when illuminated produces electricity. During the doping process, an oxide layer also forms on the semiconductor wafer. The method further comprises the step of oxide etching the semiconductor wafer after heating the semiconductor wafer. In this step the semiconductor wafer is cleaned and also any oxide which formed during heating in the diffusion furnace is removed. This step is typically a wet chemistry etch and is usually performed in a bath that comprises hydrofluoric acid.

The method further comprises metallizing the rear side of the semiconductor wafer. Metallizing the rear side of the semiconductor wafer provides an electrode which forms part of the electrical connection to the photovoltaic cell. Additionally the metallization can also cause the rear side of the semiconductor wafer to become reflective. This can be used to reflect any photons which travel through the semiconductor wafer back into the semiconductor wafer. In this way efficiency can be increased. The method further comprises the step of patterning metal paste on the front side of the semiconductor wafer. The metal paste typically comprises silver. The metal paste is patterned such that it forms electrodes for performing an electrical connection with the n-type material on the front side of the semiconductor wafer. The metallization on the rear side forms an electrical connection to the bulk p-type material of the silicon wafer. The method further comprises the step of firing the semiconductor wafer in the metallization furnace. In this step the metal paste is heated to the point where it forms an electrical connection with the front side of the semiconductor wafer. The method further comprises the step of depositing a dielectric layer on the front side after doping the photovoltaic cell. The dielectric layer is typically deposited on the front side of a semiconductor wafer for several different reasons. The dielectric layer can be chosen such that it reduces the reflectivity of the finished photovoltaic cell. Any photons which are reflected from the photovoltaic cell are not used to generate electricity via the photoelectric effect. Reducing the reflectivity of the front side therefore increases the efficiency of the photovoltaic cell. Additionally a dielectric layer can be used to passivate the surface of the photovoltaic cell. The n-type material on the surface may have reactive chemical bonds which affect the operation of the photovoltaic cell. The silicon oxide layers are effective at passivating the surface of a silicon wafer. Silicon nitride layers are typically used for producing an antireflective layer on the front side or surface of photovoltaic cells. The dielectric layer may be deposited before the metal paste is patterned on the front side of the semiconductor wafer or it may be deposited after the semiconductor wafer has been fired in the metallization furnace.

When the dielectric layer is deposited depends upon how the photovoltaic cell may be used to manufacture a photovoltaic module. A photovoltaic module is a collection of photovoltaic cells wired together. Typically the dielectric layer is deposited before the metal paste is patterned. The firing of the semiconductor wafer is therefore very critical because the metal paste on the front side of the semiconductor wafer forms an electrical connection to the n-type material on the front side of the semiconductor wafer through the dielectric layer. The reason why the dielectric layer is typically deposited first is because if the dielectric layer is deposited over the front electrode then it becomes difficult to form an electrical connection or to wire photovoltaic cells together. Alternatively photovoltaic cells may be manufactured and the front electrode formed using the metal paste and then wired together in a photovoltaic module. After the photovoltaic module has been assembled with the photovoltaic cells then a dielectric layer is deposited on each of the photovoltaic cells. In this case since the photovoltaic cells have already been wired together it is alright to put the dielectric layer over the top. Once they have been wired together there is no longer a need to form any new electrical connections.

The method further comprises the step of measuring a set of characterization parameters. The set of characterization parameters comprises measuring the front surface recombination of the wafer after oxide etching the semiconductor wafer. Front surface recombination may be measured by illumination probing. This is typically accomplished by biasing the cell either in forward or reverse mode. A thermograph or a camera which is able to detect infrared radiation can be used to locate regions on the front surface which have high recombination. Areas with high recombination become warmer than regions with low front surface recombination. The set of characterization parameters further comprises measuring the base contact resistance before metalizing the rear side of the semiconductor wafer. The base contact resistance is the contact resistance on the rear side of the semiconductor wafer. The base contact resistance may be measured using local probing. For example a four point probe may be used to measure the base contact resistance.

The method further comprises the step of calculating a predicted efficiency of the photovoltaic cell using the set of characterization parameters. The set of characterization parameters may be used to calculate a predicted efficiency or estimate of the overall efficiency of the photovoltaic cell. This is particularly beneficial, because when photovoltaic cells are wired together in a photovoltaic module a photovoltaic cell which produces a lower voltage in the case of photovoltaic cells that are wired in parallel or a photovoltaic cell which produces less current than the other photovoltaic cells in the case where photovoltaic cells are wired together in series will limit the efficiency of the other photovoltaic cells. For this reason it is critical to identify photovoltaic cells which have the same efficiency and electrical performance. This is a particularly difficult task, because the efficiency of the photovoltaic cell depends upon many different parameters and may also be a function of the temperature of the photovoltaic cells. Measuring a set of characterization parameters and then using them to calculate a predicted efficiency allows photovoltaic cells with a particular efficiency to be more easily identified. The photovoltaic cells may then be used to manufacture photovoltaic modules which have a higher efficiency.

In an embodiment of the invention, the step of measuring a set of characterization parameters further comprises measuring the carrier lifetime before depositing the dielectric layer on the front side of the semiconductor wafer. The carrier lifetime of the front surface may be measured by using a contact free surface mapping. The decay rate of electrons in the surface is measured. This embodiment is advantageous because the carrier lifetime may have a significant impact on the efficiency of a photovoltaic cell.

In another embodiment the step of measuring a set of characterization parameters further comprises measuring the rear surface recombination before metallizing the rear side of the semiconductor wafer. This embodiment is also advantageous because the rear surface recombination may have a significant impact on the efficiency of the finished photovoltaic cell. The rear surface recombination may be measured in the same fashion that the front surface recombination is measured.

In an embodiment of the invention the step of measuring a set of characterization parameters further comprises measuring the n-doping of the front surface after the step of oxide etching the semiconductor wafer. The n-doping may be measured using a four point probe or other means to measure the sheet resistance.

In an embodiment of the invention the step of measuring a set of characterization parameters further comprises measuring the external front reflectance of the semiconductor wafer before metallizing the rear side of the semiconductor wafer. This is measured before metallizing the rear side of the semiconductor wafer, because the rear side metallization affects the reflectivity of the rear side and may reflect photons also. The external reflectance is a critical parameter, because reflected photons do not contribute to generating electricity by the photovoltaic effect in the photovoltaic cell.

In an embodiment of the invention, the step of measuring a set of characterization parameters further comprises measuring the internal rear reflectance after metallizing the rear side of the semiconductor wafer. The internal rear reflectance is measured after metallization, because then the measurement may be compared with the external front reflectance measurements to calculate the rear reflectance. If photons are reflected off of the rear side of the silicon wafer then the measured reflectance will increase.

In an embodiment of the invention the step of measuring a set of characterization parameters further comprises measuring the p-type doping of the front side before performing the step of doping the semiconductor wafer. This has to be measured before the doping is performed, because when the surface is doped then it will be covered by an n-type material and not be clean. After the semiconductor wafer has been heated in the diffusion furnace then the surface will no longer be p-type but instead will be n-type.

In an embodiment of the invention the step of measuring a set of characterization parameters further comprises the step of measuring the emitter contact resistance before the step of depositing a dielectric layer on the front side of the semiconductor wafer. The emitter contact resistance can be measured using a four point probe on the front surface. The emitter contact resistance refers to the front side contact resistance. Base contact resistance refers to the rear side contact resistance.

In an embodiment of the invention the predicted efficiency is calculated using a model. For example the PC1D solar cell model may be used by varying these parameters to predict or simulate an efficiency of the finished solar cell. By varying the value of characterization parameters using a simulation, a dependency of the final efficiency of the photovoltaic cell may be determined for each of the characterization parameters. This may then be used in a model which takes the characterization parameters as an input to calculate a predicted efficiency of the photovoltaic cell.

In an embodiment of the invention the method further comprises the step of binning the semiconductor wafer to a group of semiconductor wafers using the predicted efficiency. The group of semiconductor wafers is used for manufacturing a photovoltaic module. It is beneficial to bin the semiconductor wafer in this way because the semiconductor can be binned into a group of semiconductor wafers which have a similar predicted efficiency. Doing this before manufacturing a photovoltaic module reduces the chances that a photovoltaic cell which has a lower efficiency than the other photovoltaic cells will be included. As was mentioned before, a photovoltaic cell with a lower efficiency can drag down the efficiency of a whole photovoltaic module or a section of a photovoltaic module.

In an embodiment of the invention, the method further comprises the step of measuring the efficiency of a photovoltaic cell. The method further comprises the step of comparing the measured efficiency to the calculated efficiency. The method further comprises the step of adjusting the model using the comparison between the measured efficiency and the calculated efficiency. In this embodiment, the model is corrected by comparing the predicted efficiency to a measured efficiency. Mathematical techniques such as principal component analysis or multivariate statistical analysis may be used to improve the model. The model can be adjusted, as discussed above, by iterations using experimental or production data. This also enables to eliminate over time less significant characterization parameters from the model. This reduces effort and cost.

In an embodiment of the invention the method further comprises the step of texturing the front surface before the step of doping the photovoltaic cell. It is beneficial to texture the front surface, because it reduces the reflectivity of the front side. Reflected photons do not contribute to the generation of electricity so reducing the reflectivity increases the efficiency of the photovoltaic cell.

In an embodiment of the invention the method further comprises the step of measuring a cleanliness rating of the front surface of the semiconductor wafer before the step of doping the semiconductor wafer. A cleanliness rating is a measure of the cleanliness of the front surface of the semiconductor wafer. For instance this could be a rating of how much of the front surface is covered by dust or other debris or it may also be a measure of how many dust particles are on the front surface per unit area. The cleanliness rating may be measured using a camera inspection system or it may be measured using a measure system which is scattered by the presence of dust. The method further comprises the step of cleaning the front surface if the cleanliness rating is below a predetermined threshold. This is beneficial, because if the front surface is very dirty when the semiconductor wafer is doped then the doping of the front surface may be non-uniform. When the semiconductor wafer is heated in the diffusion furnace then the n-doping of the front surface will be non-uniform. This may lead to a decrease in the efficiency of the photovoltaic cell. It is therefore beneficial to clean the front surface if there are a large number of particulates on the front surface.

BRIEF DESCRIPTION OF THE DRAWINGS

In the following, preferred embodiments of the invention will be described in greater detail by way of example only making reference to the drawings in which.

DETAILED DESCRIPTION

In the following, like numbered elements in these figures are either similar elements or perform an equivalent function. Elements which have been discussed previously will not necessarily be discussed in later figures if the function is equivalent.

Figure 1:
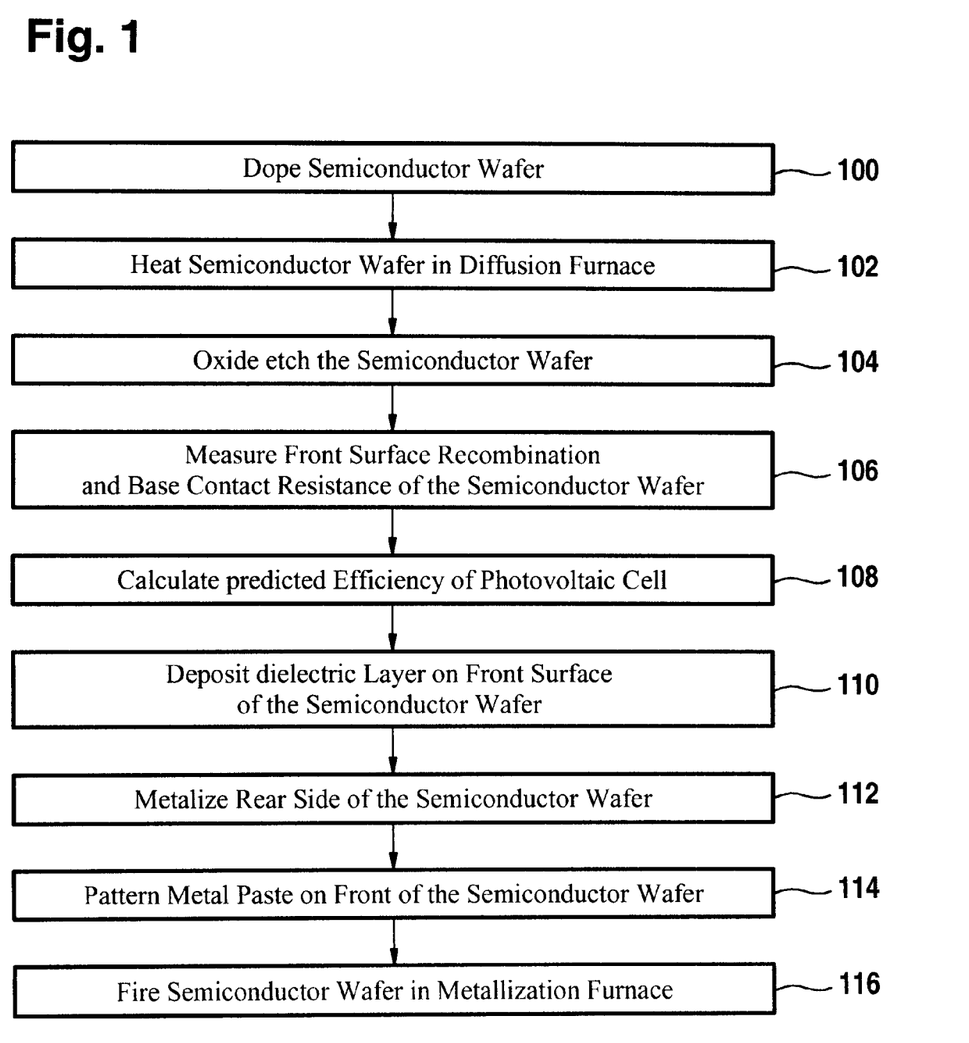
FIG. 1 shows a block diagram which illustrates an embodiment of the invention.

FIG. 1 shows a block diagram which illustrates an embodiment of the invention. In step 100 a semiconductor wafer is doped. In step 102 the wafer is heated in a diffusion furnace. In step 104 oxide which formed on the surface of the semiconductor wafer in the diffusion furnace is removed using an oxide etch. The semiconductor wafer is cleaned and has the oxide layer removed in this step. In step 106 the front surface recombination of the front side and base contact resistance of the rear side of the semiconductor wafer are measured. In step 108 a predicted efficiency of the photovoltaic cell which is manufactured using the semiconductor wafer is calculated. This predicted efficiency may be used later to bin the finished photovoltaic cell with other photovoltaic cells which have a similar efficiency. In step 110 a dielectric layer is deposited on the front surface of the semiconductor wafer. This dielectric layer may serve to passivate and/or function as an antireflective layer for the front side of the semiconductor wafer.

In step 112 the rear side of the semiconductor wafer is metallized. In step 114 a metal paste is patterned on the front of the semiconductor wafer. Typically a silver-based paste is used and the pattern forms the front electrode after firing. In step 116 the semiconductor wafer is fired in a metallization furnace. The metal paste which was patterned on the front of the semiconductor wafer then forms a solid metal electrode which forms the front electrode on the front side of the semiconductor wafer.

Figure 2:
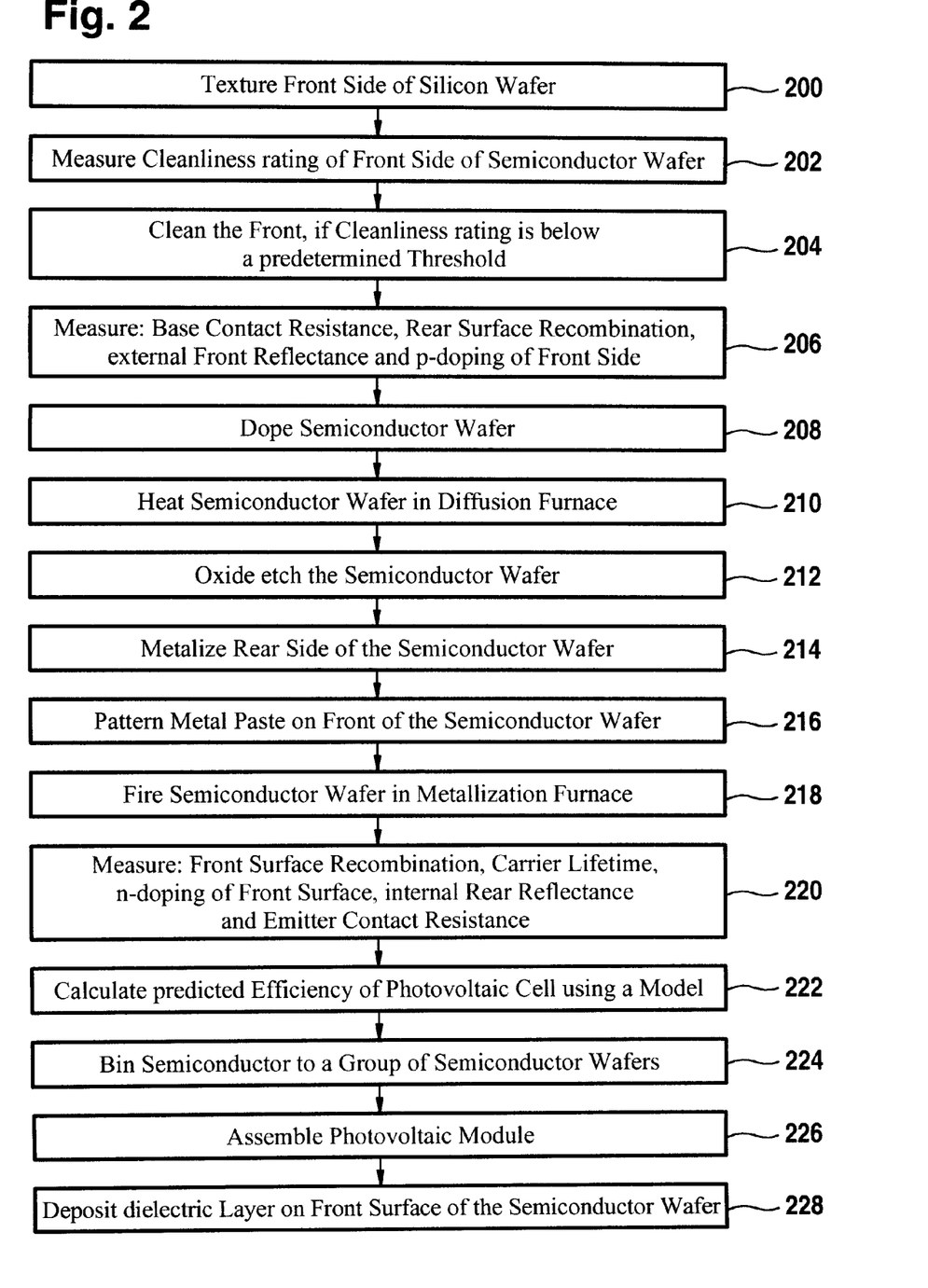
FIG. 2 shows a block diagram which illustrates a further embodiment of the invention.

FIG. 2 shows a block diagram of a further embodiment of a method according to the invention. In step 200 the front side of a silicon wafer is textured to reduce the reflectivity of the front side. In step 202 the cleanliness rating of the front side of a semiconductor wafer is measured. In step 204 the front side is cleaned if the cleanliness rating is below a predetermined threshold. In step 206 the base contact resistance, the rear surface recombination, the external front reflectance and p-doping of the front side is measured.

In step 208 the semiconductor wafer is doped. In step 210 the semiconductor wafer is heated in a diffusion furnace. In step 212 the semiconductor wafer is cleaned and oxide which formed in the diffusion furnace is etched away. For silicon a hydrofluoric-based etchant is typically used. In step 214 the rear side of the semiconductor wafer is metallized. This is typically done using aluminum. In step 216 metal paste is patterned on the front of the semiconductor wafer as the first step informing the electrode on the front side. In step 218 the semiconductor wafer is fired in the metallization furnace. At this point the front electrode on the front side of the semiconductor wafer has been formed.

In step 220 the front surface recombination, the carrier lifetime, n-doping of the front surface, the internal rear reflectance, and the emitter contact resistance are measured. In step 222 the quantities measured in steps 206 and 220 are used in a model to calculate a predicted efficiency of the photovoltaic cell which is manufactured using the silicon wafer. In step 224 the semiconductor wafer is binned into a group of semiconductor wafers which have an efficiency that is similar in range to the predicted efficiency of the silicon wafer. In step 226 the semiconductor wafer along with other wafers from the same group of semiconductor wafers is used to assemble a photovoltaic module.

In step 228 a dielectric layer is deposited on the front surface of the semiconductor wafer. In this particular embodiment it is likely that the photovoltaic cells used to manufacture the photovoltaic module are wired together before the dielectric layer was deposited on the front surface of the semiconductor wafer. This method could also be performed alternatively by depositing the dielectric layer on the front surface before the rear side of the semiconductor wafer is metallized. In this case the measurements performed in step 220 would be performed before the dielectric layer is deposited on the front surface of the semiconductor wafer with the exception of the internal rear reflectance measurement which needs to be performed after the rear side metallization is performed.

In the following figures, equations, and tables the following abbreviations are used: front surface recombination is abbreviated FSV, base contact resistance is abbreviated BC, carrier lifetime is abbreviated CLT, rear surface recombination is abbreviated RSV, n-doping is abbreviated ND, external front reflectance is abbreviated EFR, and internal rear reflectance is abbreviated IRR.

Figure 3:
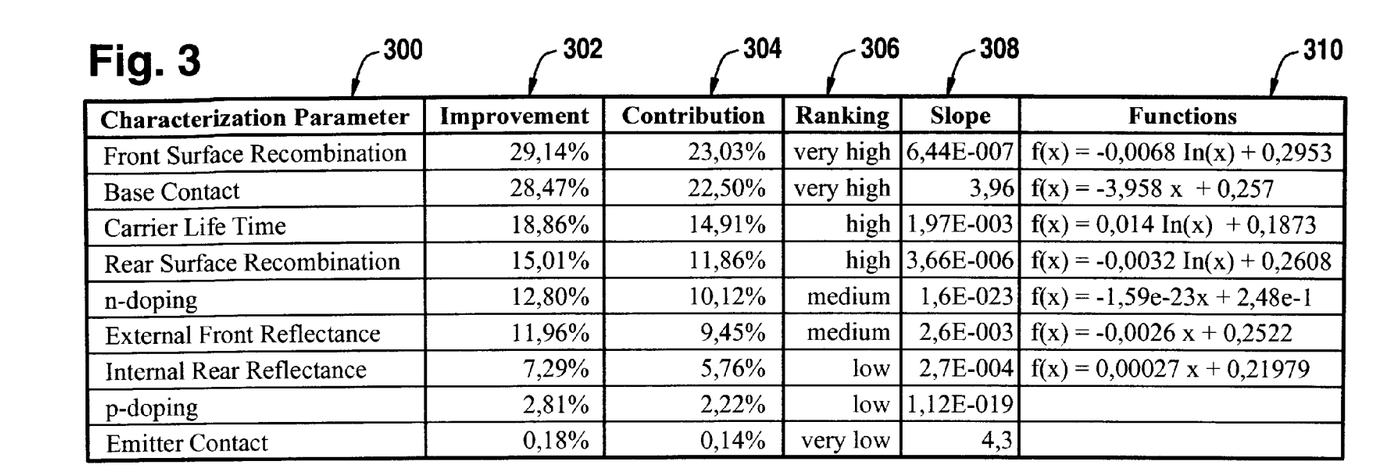
FIG. 3 shows a table which summarizes modeling results for photovoltaic cell optimization using the PC1D solar cell model.

FIG. 3 shows a table which illustrates a modeling result summary for photovoltaic cell optimization using the PC1D solar cell model. PC1D is a one dimensional semiconductor device simulator that is widely used for simulating photovoltaic cells.

Column 300 shows a list of characterization parameters. Column 302 indicates to what extent a characterization parameter may be used to improve the efficiency. Column 304 indicates the contribution of the characterization parameter to the model. The contribution in column 304 may also be thought of as a weighting parameter. Column 306 shows a subjective ranking of the importance of the individual characterization parameters. 308 shows the slope of a linear fit of a variance of the parameter with regard to the efficiency of the photovoltaic cell. Finally in column 310 equations used by the model are shown for calculating the predicted efficiency.

The modeling gives a parameter ranking for the binning as well as the necessary initial weighting factors. These starting criteria are listed in the table shown in FIG. 3. Also shown are the functions 310 for the characterization parameters used to calculate the predicted efficiency.

Figure 4:
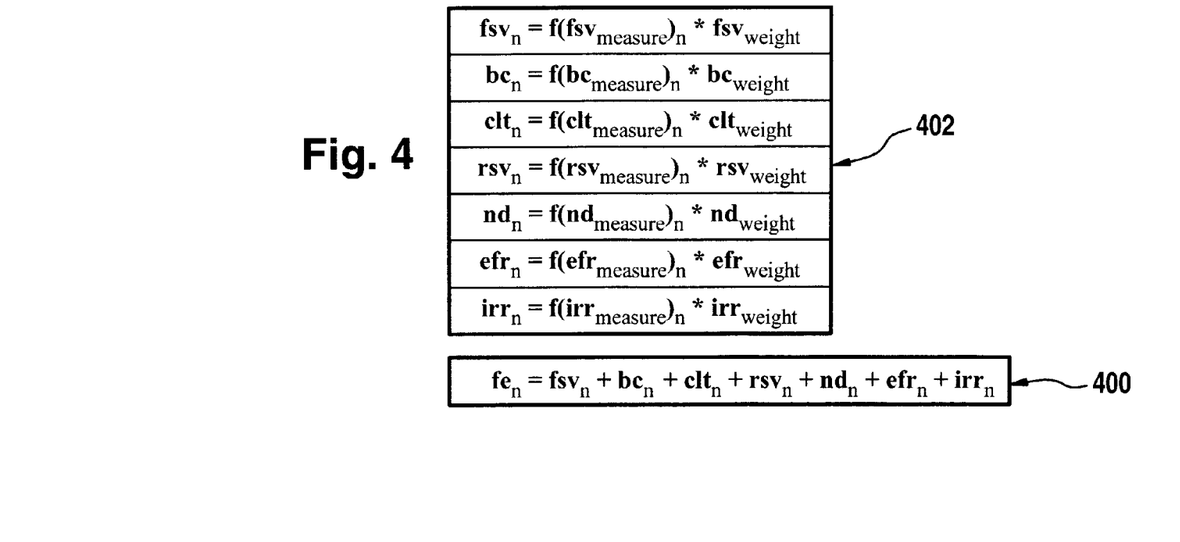
FIG. 4 shows equations which may be used to calculate the predicted efficiency.

FIG. 4 shows an equation 400 which indicates how the predicted efficiency is calculated. The quantities in box 402 show how the individual items on the right hand side of equation 400 are calculated. The weighting values on the right side of the equations in box 402 are made using the numbers in column 304 of FIG. 3. The functions on the right hand side of the equations in box 402 are taken from column 310 of FIG. 3.

The final calculated efficiency (fe) is a summary of the weighted efficiency from the critical parameters. This is used for the calculation examples listed below.

The base idea is to establish a wafer characterization which can be used to bin the wafers at least as good as the actual cell binning. The wafers, having pn-junction as well as back side contact, can than be assembled on module level and finished concerning cell/module function.

Figure 5:
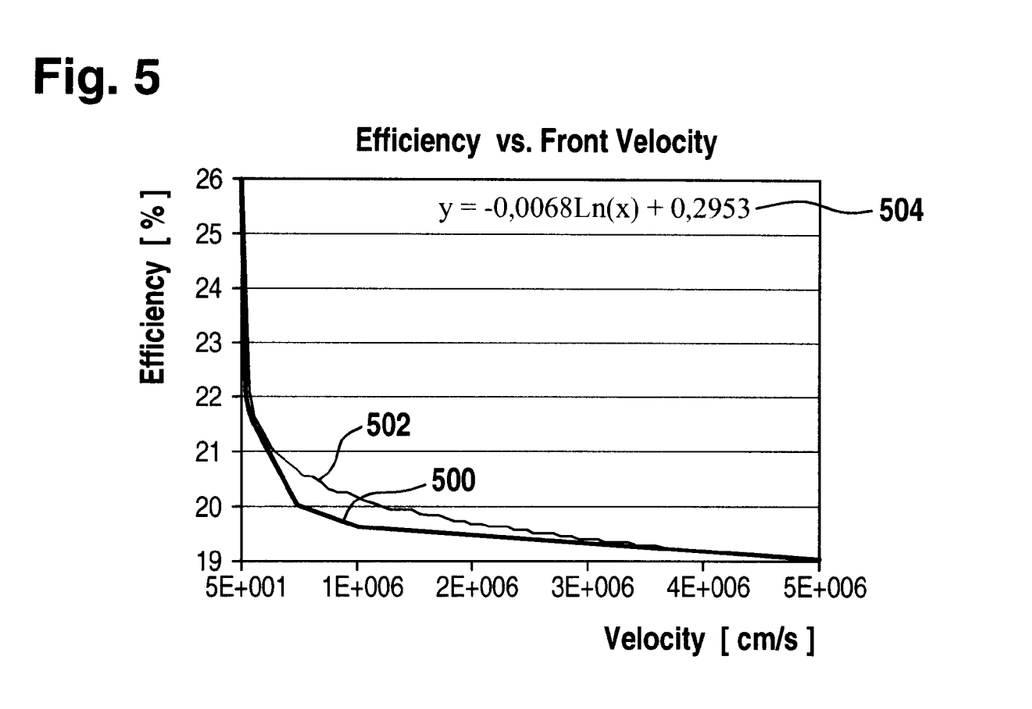
FIG. 5 shows calculated photovoltaic cell efficiency as a function of front velocity used for measuring front surface recombination.

FIG. 5 shows results from the solar cell model PC1D. In this figure the efficiency of the photovoltaic cell is determined as a function of electron velocity. This is for the front surface recombination. Curve 500 shows the results of the PC1D model and curve 502 shows a log rhythmic approximation 502 of the curve 500. The equation 504 is the equation for the curve 502.

Figure 6:
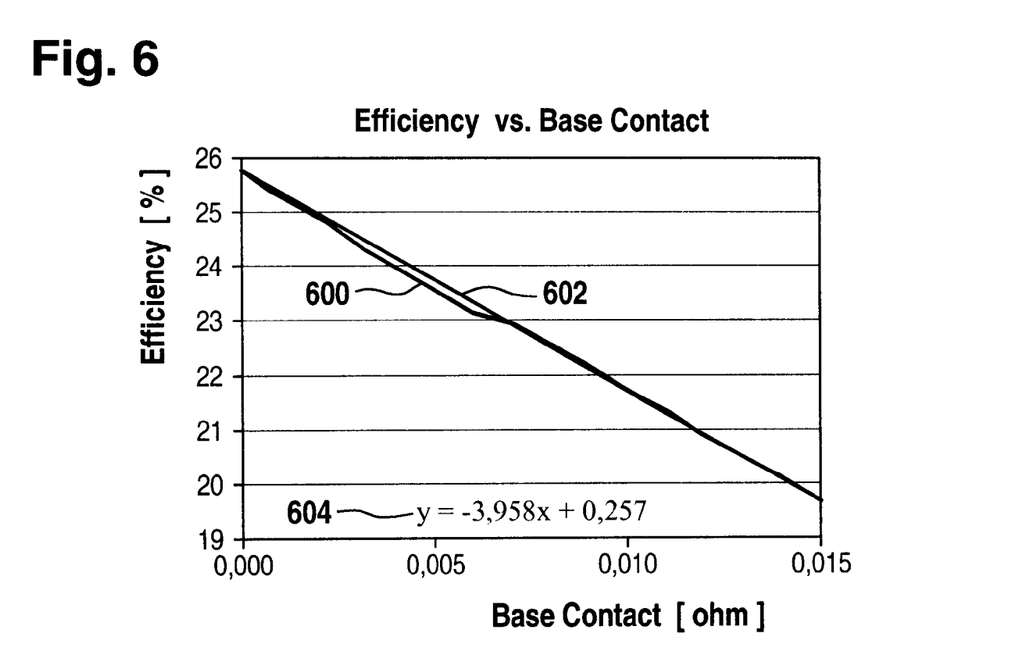
FIG. 6 shows calculated photovoltaic cell efficiency as a function of the base contact resistance.

FIG. 6 shows a change in efficiency as the base contact resistance is varied. Again these numbers were calculated using the PC1D solar cell model. The curve 600 shows the calculations from the PC1D model. The straight line 602 shows a linear fit to the values of curve 600. The equation 604 is the equation of line 602.

Figure 7:
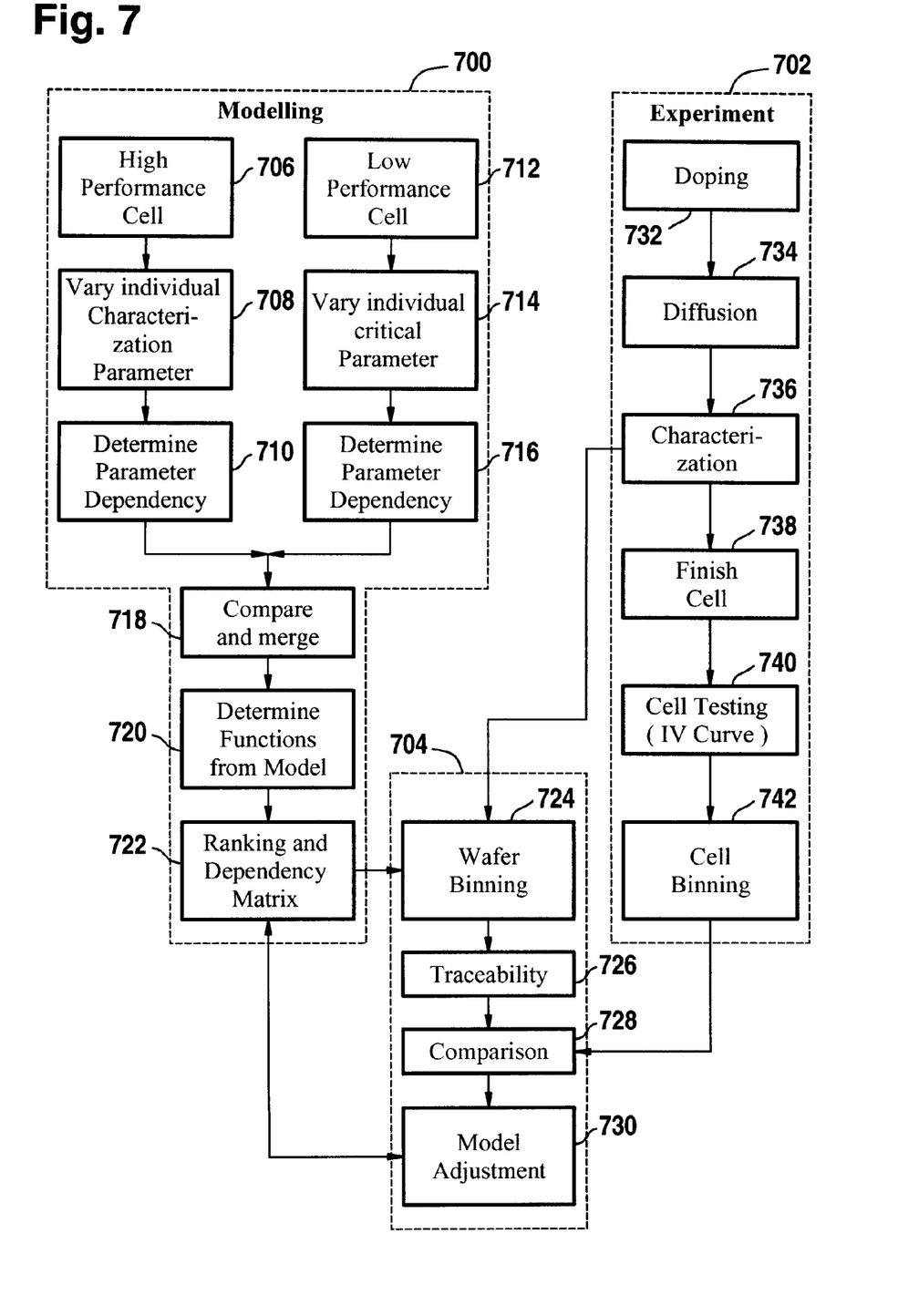
FIG. 7 shows a block diagram which illustrates a further embodiment of the invention.

FIG. 7 shows an embodiment of the invention using a block diagram. In this embodiment experimental data is compared to modeling data to improve the quality of the model. In the steps 700 modeling data is used. The steps indicated by the bracket 702 show process flow and experimental steps. In the steps 704 the wafers are binned and a comparison is made between modeling and experimental results. For developing a model first a high performance photovoltaic cell 706 is simulated. Individual characterization parameters 708 are then varied. In step 710 a determination of parameter dependency is determined. Also for the modeling a low performance photovoltaic cell 712 is modeled. In step 714 the individual parameters of the low performance cell are varied. Next a determination of parameter dependency 716 for the low performance cell is then determined.

In step 718, a comparison is made between the parameter dependencies for the high performance and the low performance cell. In this comparison a determination is made for the functional form of the model 720. For instance for the equations shown in column 310 in FIG. 3 some quantities are linear and are represented by linear fit and some quantities are best fit by a log rhythmic curve. This is also illustrated in FIGS. 5 and 6. In step 732 a wafer is doped. In step 734 the wafer which has just been doped is put into a diffusion furnace to form the n-type layer on the front side of the silicon wafer. In step 736 measurements are made of the set of characterization parameters. When the determination of the functional form of the model is made in 722 a ranking and dependence matrix 722 which was constructed may be used with a set of measured characterization parameters to estimate the efficiency of a photovoltaic cell. In step 724 measurements from the characterization 736 and the ranking dependency matrix 722 are used to calculate an efficiency of the photovoltaic cell and are used to bin the wafer into a group of photovoltaic cells which has an efficiency which is within a predetermined range. In step 726 after binning, the wafers are traceable so that results can be compared with later measurements.

After the characterization in 736 was performed the photovoltaic cell and its manufacturing processes 739 completed. After manufacturing of the photovoltaic cell was finished the cell was tested and the current voltage curve 740 of the photovoltaic cell was measured under illumination. After testing under illumination the photovoltaic cells were binned 742 according to their efficiency. In step 728 the wafer binning from steps 724 and 726 are combined with the measured binning of step 742. The comparison made in step 728 is then used in step 730 for a model adjustment 730. In this step 730 the ranking and dependency matrix which was calculated in step 722 may be altered. The embodiment shown in FIG. 7 is illustrative of how modeling and experimental measurements can be used together to improve the quality of a model.

Figure 8:
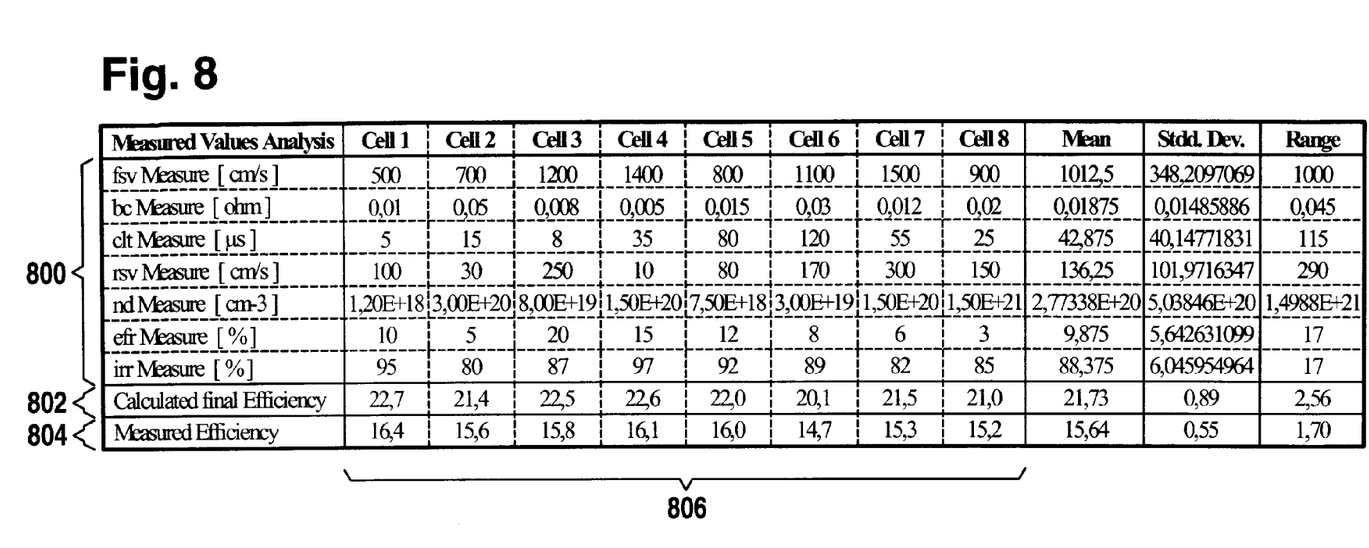
FIG. 8 shows a table with measured values of characterization parameters as well as calculated and measured photovoltaic cell efficiencies.

FIG. 8 shows a table with measured values of characterization parameters 800, calculated efficiency 802 and measured efficiency 804 for a collection of eight wafers 806.

Figure 9:
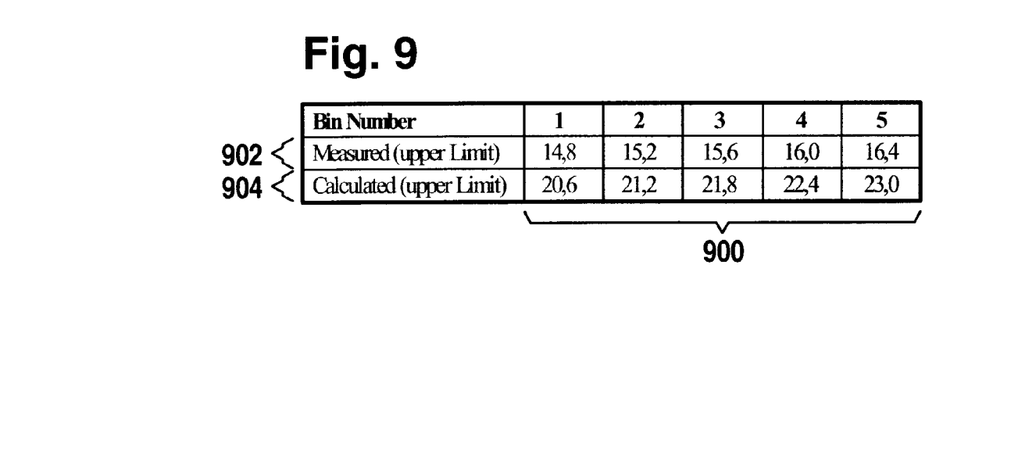
FIG. 9 shows a table which illustrates possible bins for sorting semiconductor wafers.

The table in FIG. 9 shows five bins 900 for the measured values 902 shown in FIG. 8 also the calculated values 904 from the table in FIG. 8.

Figure 10:
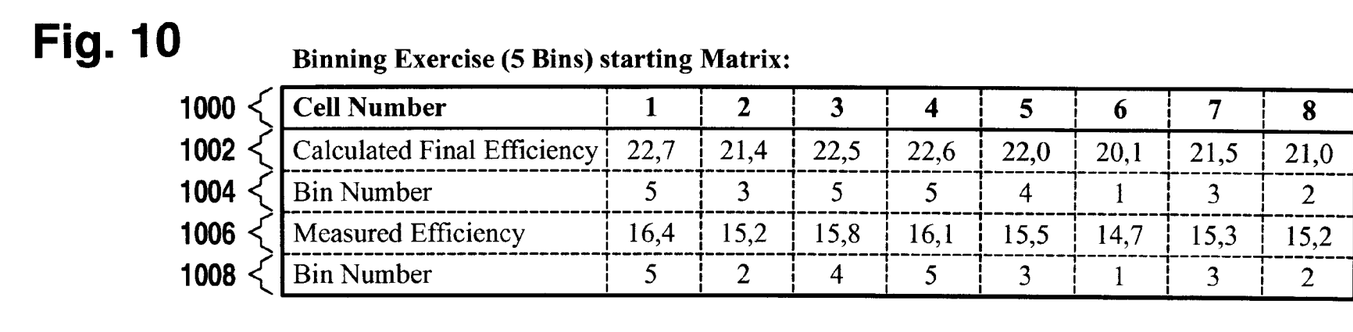
FIG. 10 shows a table which illustrates how the wafers in the table of FIG. 8 may be binned into the bins illustrated in the table of FIG. 9.

The table in FIG. 10 shows how eight wafers are placed into the bins of FIG. 9. Row 1000 shows the number of the wafer. 1002 shows the calculated efficiency for each wafer 1000. Row 1004 shows the bin each wafer is placed into based upon the calculated efficiency 1002. Row 1006 shows the measured efficiency for each of the wafers. Row 1008 shows the binning of each of the wafers based upon the measured efficiency 1006.

Figure 11:
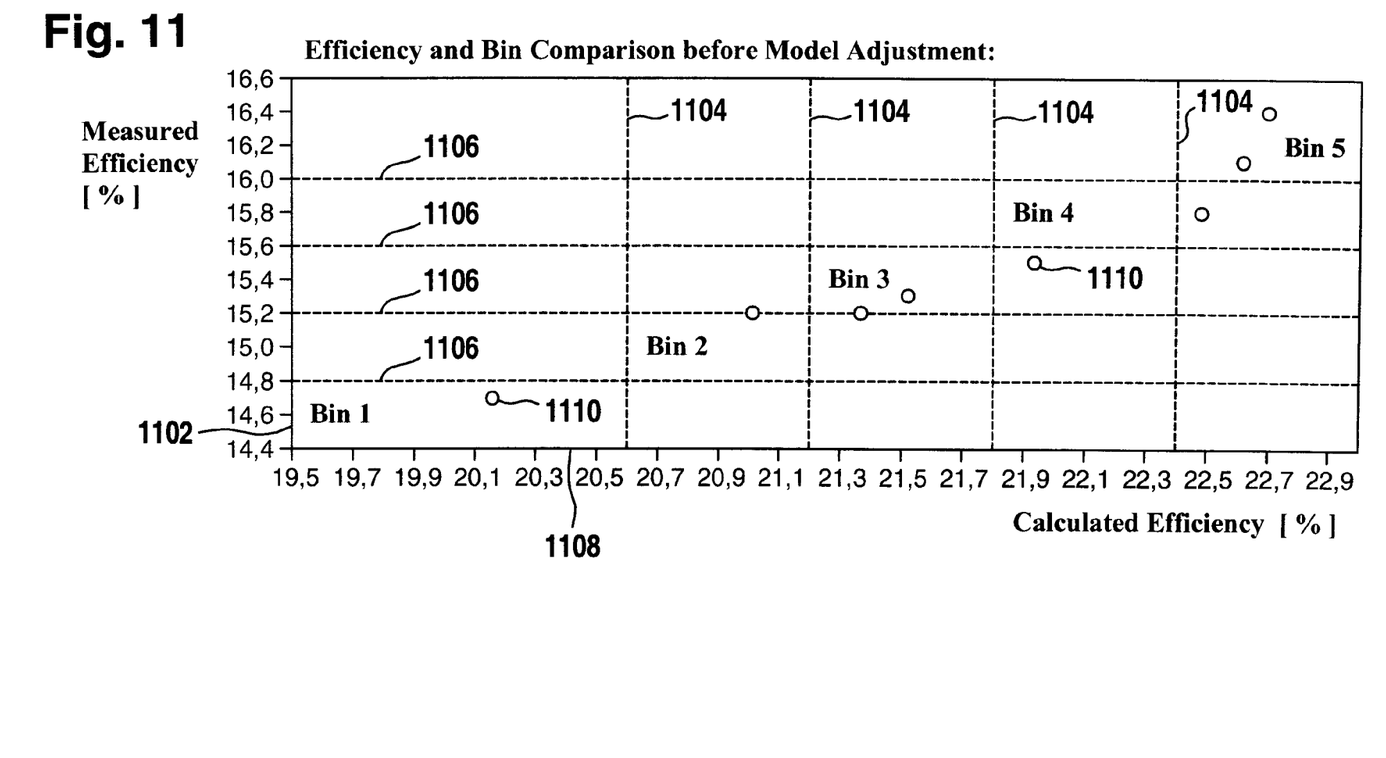
FIG. 11 shows a plot which compares the binning of the wafers based upon the calculated efficiency and the measured efficiency for the wafers described in the table of FIG. 8.

FIG. 11 shows a plot which shows a comparison of the binning based upon the calculated efficiency and the measured efficiency. The calculated efficiency is the x-axis. The measured efficiency is the y-axis 1102. Vertical lines 1104 indicate divisions between bins based on the calculated efficiency. Horizontal lines indicated by 1106 indicate divisions between bins based on the measured efficiency 1102. This figure indicates that the binning done by the model does not match the binning by the measured efficiency. For instance the wafers indicated by 1108 are both located in the same bin for the calculated and measured efficiency. However, there are many points which are not in the same bin. For instance the wafer labeled 1110 is in bin 4 based on the calculated efficiency and is in bin 3 based upon the measured efficiency. Using the measured efficiency the model may be improved. By changing the weighing factor of the front surface recombination the efficiencies have been recalculated.

Figure 12:
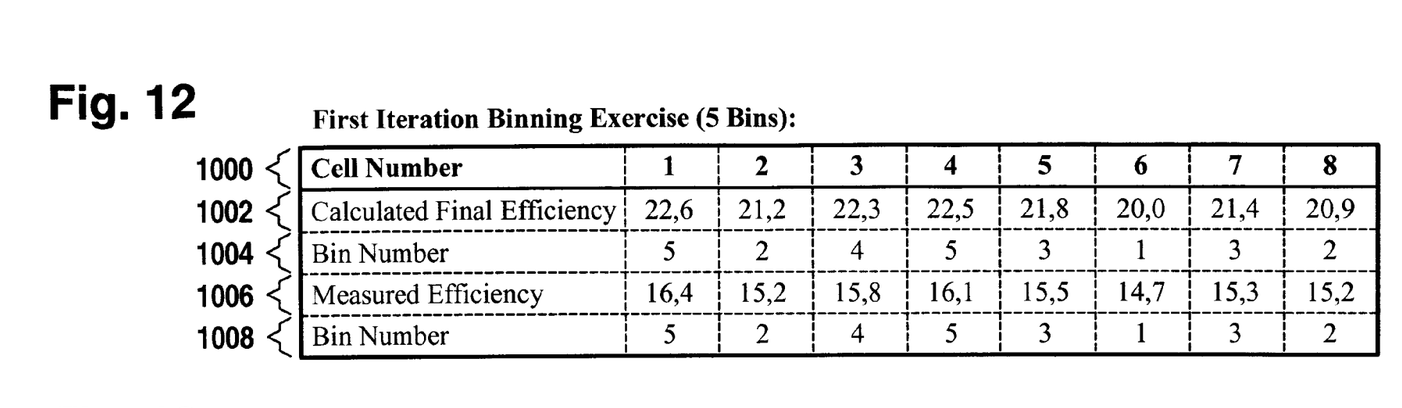
FIG. 12 shows a table with recalculated efficiencies for the wafers described in the table of FIG. 8.

FIG. 12 shows a table which lists the recalculated efficiencies after the weighting factor for the front surface recombination was changed. A possibility is also to adjust the model in the other direction, not based on the experimental cell/module data. This would have the consequence that the initial cell binning, performed on final cell, would have to be adjusted.

Figure 13:
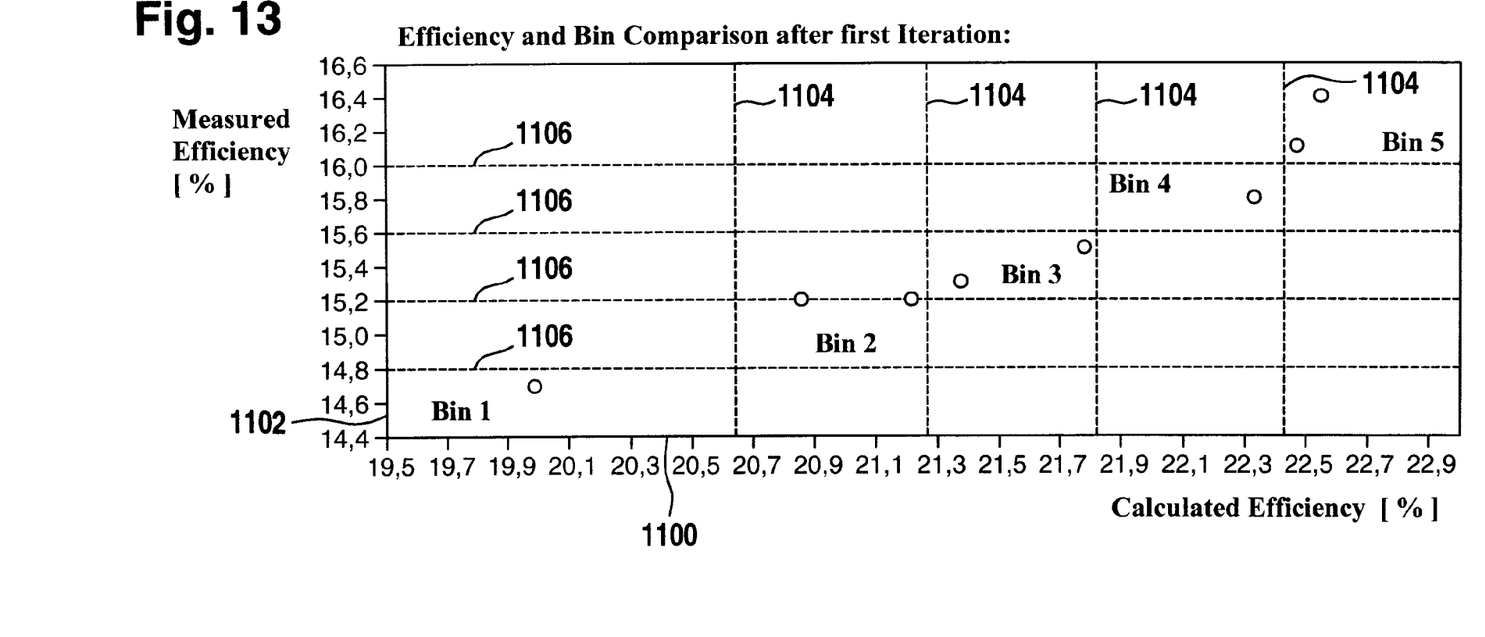
FIG. 13 shows a plot which compares the binning of the wafers based upon the calculated efficiency and the measured efficiency for the data in the table of FIG. 12.

FIG. 13 illustrates the data from FIG. 12. FIG. 13 has the same format as does FIG. 11. In the example shown in FIG. 13 we now see that with the adjustment of the weighting factor for the front surface recombination that using the experimental efficiencies or the calculated predicated efficiencies wafers are placed into the same bin. This illustrates the benefit of adjusting the model using experimental data not only from cell but also module level.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method of determining an efficiency of a photovoltaic cell, wherein the photovoltaic cell is manufactured on a semiconductor wafer having a front side and a rear side, wherein the photovoltaic cell produces electricity when the front side of the semiconductor wafer is illuminated, the method comprising the steps of:

doping the semiconductor wafer;

heating the semiconductor wafer in a diffusion furnace after doping the semiconductor wafer;

oxide etching the semiconductor wafer after heating the semiconductor wafer;

metalizing the rear side of the semiconductor wafer;

patterning metal paste of the front side of the semiconductor wafer;

firing the semiconductor wafer in the metallization furnace;

depositing a dielectric layer on the front surface after doping the photovoltaic cell;

measuring a set of characterization parameters, including the front surface recombination of the wafer after oxide etching the semiconductor wafer and measuring the base contact resistance before metalizing the rear side of the semiconductor wafer; and calculating the efficiency of the photovoltaic cell using the set of characterization parameters for binning the photovoltaic cell by its efficiency in order to facilitate the manufacture of a photovoltaic module.

2. The method of determining an efficiency of a photovoltaic cell of claim 1, wherein the step of measuring a set of characterization parameters further comprises measuring the carrier life time before depositing the dielectric layer on the front side of the semiconductor wafer.

3. The method of determining an efficiency of a photovoltaic cell of claim 2, wherein the step of measuring a set of characterization parameters further comprises measuring the rear surface recombination before metalizing the rear side of the semiconductor wafer.

4. The method of determining an efficiency of a photovoltaic cell of claim 3, wherein the step of measuring a set of characterization parameters further comprises measuring the n doping of the front surface after the step of oxide etching the semiconductor wafer.

5. The method of determining an efficiency of a photovoltaic cell of claim 4, wherein the step of measuring a set of characterization parameters further comprises measuring the external front reflectance of the semiconductor wafer before metalizing the rear side of the semiconductor wafer.

6. The method of determining an efficiency of a photovoltaic cell of claim 5, wherein the step of measuring a set of characterization parameters further comprises measuring the internal rear reflectance after metalizing the rear side of the semiconductor wafer.

7. The method of determining an efficiency of a photovoltaic cell of claim 6, wherein the step of measuring a set of characterization parameters further comprises measuring the p doping of the front side before the step of doping the semiconductor wafer is performed.

8. The method of determining an efficiency of a photovoltaic cell of claim 7, wherein the step of measuring a set of characterization parameters further comprises the step of measuring (220) the emitter contact resistance before the step of depositing the dielectric layer on the front side of the semiconductor wafer.

9. The method of determining an efficiency of a photovoltaic cell of claim 8, wherein the predicted efficiency is calculated using a model.

10. The method of determining an efficiency of a photovoltaic cell of claim 9, wherein the method further comprises the step of measuring a measured efficiency of the photovoltaic cell; wherein the method further comprises the step of comparing the measured efficiency to the efficiency; and wherein the method further comprises the step of adjusting the model using the comparison between the measured efficiency and the efficiency.

11. The method of determining an efficiency of a photovoltaic cell of claim 10, wherein the method further comprises the step of texturing the front side before the step of doping the photovoltaic cell.

12. The method of determining an efficiency of a photovoltaic cell of claim 11, wherein the method further comprises the steps of:
measuring a cleanliness rating of the front surface of the semiconductor wafer before the step of doping the semiconductor wafer; and
cleaning the front surface if the cleanliness rating is above a predetermined threshold.

13. A method of manufacturing a photovoltaic module, the method comprising:
providing a group of photovoltaic cells, wherein each of the group of photovoltaic cell has an efficiency determined according to claim 12;
binning each of the group of photovoltaic cells into a plurality of subgroups using the efficiency, wherein each of the plurality of subgroups has a predetermined efficiency range;
selecting a subgroup from the of the plurality of subgroups using the predetermined efficiency range; and
assembling the photovoltaic module using the selected subgroup.

14. The method of manufacturing the photovoltaic module of claim 13, wherein assembling the photovoltaic module comprises wiring the subgroup of photovoltaic cells together, wherein the dielectric layer is deposited on the front surface of each of the subgroup after the step of wiring the photovoltaic cells together.

* * * * *